(12) United States Patent
Wallner et al.

(10) Patent No.: US 7,515,075 B1
(45) Date of Patent: Apr. 7, 2009

(54) DATA CONVERSION

(75) Inventors: Paul Wallner, Prien (DE); Chaitanya Dudha, Munich (DE); Peter Gregorius, Munich (DE); Masthan Devalla, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/856,353

(22) Filed: Sep. 17, 2007

(51) Int. Cl.
  *H03M 9/00* (2006.01)
(52) U.S. Cl. .................................... 341/100; 341/101
(58) Field of Classification Search .......... 341/100–101
   See application file for complete search history.

(56) References Cited

U.S. PATENT DOCUMENTS

| | | | |
|---|---|---|---|
| 5,128,673 A * | 7/1992 | Tamamura et al. | 341/100 |
| 5,223,833 A * | 6/1993 | Akata | 341/100 |
| 5,774,079 A * | 6/1998 | Zirngibl | 341/100 |
| 6,177,891 B1 * | 1/2001 | Nakamura | 341/100 |
| 6,259,387 B1 * | 7/2001 | Fukazawa | 341/100 |
| 6,317,372 B1 | 11/2001 | Hayashi et al. | |
| 6,339,387 B1 * | 1/2002 | Koga | 341/100 |
| 6,597,296 B2 * | 7/2003 | Izawa et al. | 341/100 |
| 6,686,856 B1 * | 2/2004 | Wang et al. | 341/100 |
| 6,762,560 B1 * | 7/2004 | Guosheng | 314/101 |
| 6,768,431 B2 * | 7/2004 | Chiang | 341/100 |

FOREIGN PATENT DOCUMENTS

WO 2006074870 7/2006

\* cited by examiner

*Primary Examiner*—Khai M Nguyen
(74) *Attorney, Agent, or Firm*—Dicke, Billig & Czaja, PLLC (57) ABSTRACT

A circuit includes a data conversion circuit including a first input configured to receive a first serial data stream, a second input configured to receive a second serial data stream, and a third input configured to receive a third serial data stream. A first sampling circuit is coupled to the first, second, and third inputs and is configured to sample the first to third data streams based on a plurality of clock signals and to generate a corresponding plurality of first sampled signals. A second sampling circuit is configured to sample the plurality of first sampled signals based on a further clock signal. The further clock signal has a clock frequency different from a clock frequency underlying the first to third serial data streams.

23 Claims, 10 Drawing Sheets

DATA CONVERSION

BACKGROUND

The present disclosure relates to data conversion.

SUMMARY

One embodiment provides a circuit including a data conversion circuit. The data conversion circuit includes a first input configured to receive a first serial data stream, a second input configured to receive a second serial data stream, and a third input configured to receive a third serial data stream. The data conversion circuit includes a first sampling circuit coupled to the first, second, and third inputs and configured to sample the first to third data streams based on a plurality of clock signals and to generate a corresponding plurality of first sampled signals. The data conversion circuit includes a second sampling circuit configured to sample the plurality of first sampled signals based on a further clock signal. The further clock signal has a clock frequency different from a clock frequency underlying the first to third serial data streams.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of various exemplary embodiments described herein may be combined with each other, unless specifically noted otherwise.

It is also to be understood that in the following description of exemplary embodiments, any direct connection are coupling between the functional blocks, devices, components, circuit elements or other physical or functional units shown in the drawings or described herein could also be implemented by an indirect connection or coupling. Furthermore, it should be appreciated that functional blocks or units shown in the drawings may be implemented as separate circuits in embodiments of the invention, but may also be fully or partially implemented in a common circuit in other embodiments of the invention.

Embodiments generally relate to data conversion. Data conversion in embodiments may for example comprise converting one or more serial data streams to one or more parallel data streams or converting one or more parallel data streams of a first width to one or more parallel data streams of a second width different from said first width. In one embodiment, additionally or alternatively data conversion comprises converting data of a first clock domain (e.g., with one or more first underlying clock signals) to data of a second clock domain (e.g., with one or more second underlying clock signals different from the first underlying clock signals).

Figure 1:
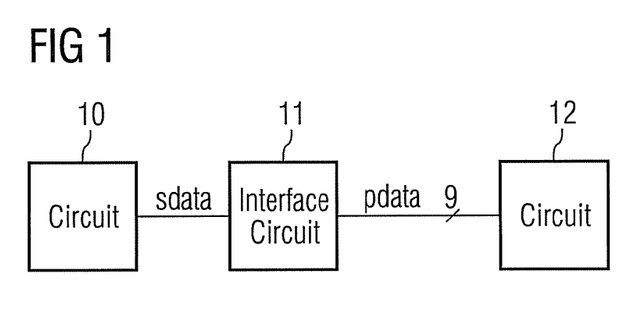
FIG. 1 illustrates an embodiment of an apparatus.

FIG. 1 illustrates an apparatus according to an embodiment. The apparatus embodiment illustrated in FIG. 1 comprises a first circuit 10, an interface circuit 11, and a second circuit 12. First circuit 10 outputs a serial data stream sdata which is received by interface circuit 11. Interface circuit 11 converts the serial data stream sdata to a parallel data stream pdata. In an embodiment, pdata may be 9 bits wide, although in a different embodiment, a different bit width may be used. pdata is received and processed by second circuit 12.

In an embodiment, first circuit 10, interface circuit 11 and second circuit 12 are implemented as separate circuits. In an embodiment, other implementations are possible, for example integrating interface circuit 11 and second circuit 12 in a single integrated circuit.

While in the embodiment illustrated in FIG. 1, a single serial data connection between first circuit 10 and interface circuit 11 and a single parallel data connection between interface circuit 11 and circuit 12 are illustrated, in another embodiment, additional connections, both serial and parallel, may be present between the various elements. Furthermore, in an embodiment, further connections may be provided to connect first circuit 10 and/or second circuit 12 to other components inside or outside the apparatus.

In an embodiment first circuit 10 is a memory controller, and second circuit 12 is a memory circuit controlled by the memory controller, for example a dynamic random access memory (DRAM) circuit. In another embodiment other types of circuits may be used.

While in the embodiment illustrated in FIG. 1, data sent via a single serial data connection is converted to parallel data sent via a single parallel data connection by interface circuit 11, in another embodiment data sent via one or more serial data connections may be converted to data sent via one or more parallel data connections. For example, in an embodiment, data sent via three serial data connections may be converted to data sent via a single parallel data connection. In this respect, a plurality of serial data connections (e.g., three serial connections) may also be seen as a parallel connection, e.g. (a 3-bit parallel connection).

In the embodiment illustrated in FIG. 1, a clock underlying parallel data stream pdata has a clock frequency corresponding to a clock frequency of a clock underlying serial data stream sdata divided by the symbol width of parallel data stream pdata (i.e., divided by the number of data symbols transmitted in parallel in parallel data stream pdata). In an embodiment, this relation changes accordingly when more than one serial data stream is used. In the following, bits will be used as an example for data symbols. For example, if the bit width of parallel data is stream pdata is 9, a clock frequency of the clock underlying pdata or in other words, a rate of 9 bit frames of pdata, is one ninth of a clock underlying sdata, or, in other words, the bit rate of sdata. To give another example, if three serial data streams having the same underlying clock frequency (or a 3-bit parallel data stream) is converted to 9-bit parallel data stream, a clock frequency underlying the 9-bit parallel data stream is ⅓ of the clock frequency underlying the three serial data streams.

Figure 2:
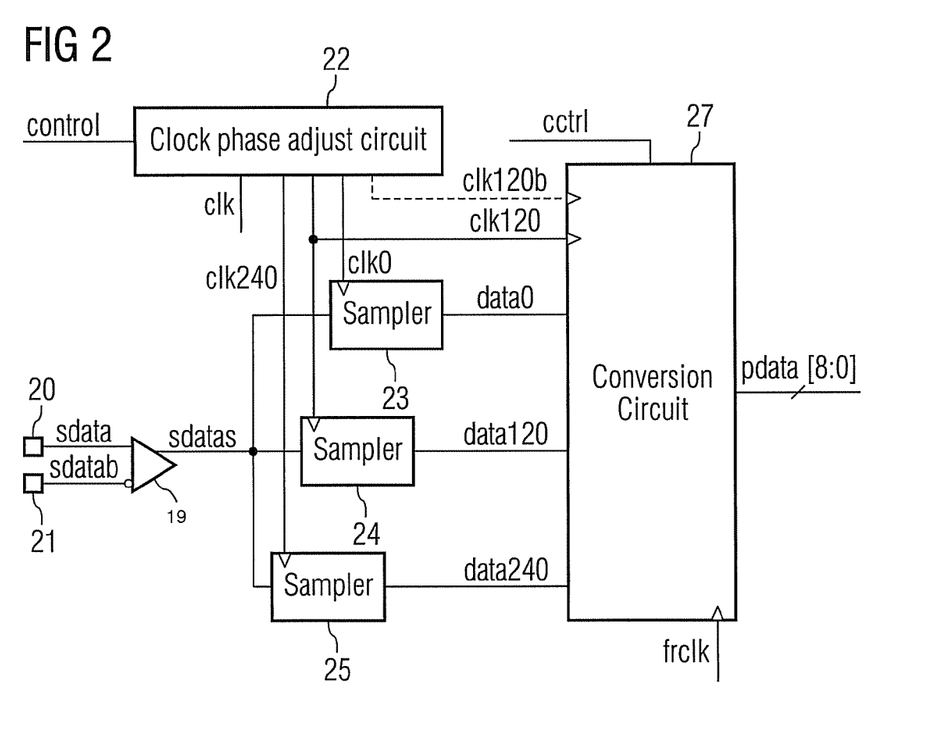
FIG. 2 illustrates an interface circuit according to an embodiment.

In FIG. 2, an embodiment of an interface circuit is illustrated which for example may be used as interface circuit 11 in the embodiment of FIG. 1, but also may be used in other electronic devices and apparatus.

The interface circuit according to the embodiment of FIG. 2 comprises inputs 20, 21 to receive a differential serial data stream sdataa, sdatab wherein sdatab is the inverted version of sdata. Sdataa and sdatab are fed to an input driver 19 outputting a single ended serial data stream sdatas based on the differential signals sdataa, sdatab. In a different embodiment, only a single input for receiving a single ended serial data stream may be provided.

In an embodiment, input driver 19 comprises an amplifier. In an embodiment, input driver 19 comprises a plurality of components, for example an equalizer or a main driver.

Serial data stream sdatas in the embodiment of FIG. 2 is a data stream clocked by an underlying clock signal. The underlying clock signal has a clock frequency and clock phase.

Serial data stream sdatas in the embodiment of FIG. 2 is fed to three sampling units 23, 24, and 25 and sampled based on clock signals clk0, clk120, and clk240, respectively. In an embodiment, sampling units 23, 24, 25 are latches or based on latches. In another embodiment, other types of sampling units like flip-flop based sampling units may be used.

In the embodiment illustrated in FIG. 2, clock signals clk0, clk120, and clk240 are generated by a clock phase adjust circuit 22 based on the above-mentioned clock signal underlying sdatas and a control signal control. Clock signals clk0, clk120, and clk240 in the embodiment of FIG. 2 each have the same clock frequency and are phase shifted with respect to each other by 120 degrees (i.e., clk120 is phase shifted by 120 degrees with respect to clk0, and clk240 is phase shifted by 120 degrees with respect to clk120). To generate clock signal clk0, clk120, and clk240, clock phase adjust circuit 22 may in an embodiment, for example, comprise a frequency divider and a delay locked loop (DLL). In the embodiment of FIG. 2, using control signal control the phase of clock signals clk0, clk120, and clk240 may be adjusted jointly to provide an optimized sampling of serial data stream sdatas, for example, to align clock signals clk0, clk120, and clk240 to an eye opening of sdatas.

In the embodiment of FIG. 2, a clock frequency of clock signals clk0, clk120, and clk240 is one third of a clock frequency of a reference clock signal clk. Note that clk need not be a clock signal actually used, but may be seen as a virtual reference clock used for explanatory purposes.

By sampling sdatas based on clock signal clk0, sampling unit 23 generates a serial data stream data0. By sampling sdatas based on clk120, sampling unit 24 generates a serial data stream data120. By sampling sdatas based on clock signal clk240, sampling unit 25 generates a serial data stream data240. In an embodiment, the data rate of serial data streams data0, data120, and data240 may be one third of the data rate of serial data stream sdatas.

In the embodiment illustrated in FIG. 2, the signals data0, data120, and data240 are fed to a conversion circuit 27. Furthermore, clk120 is also fed to conversion circuit 27. As indicated by dashed lines, in the embodiment of FIG. 2 additionally or alternatively also an inverted version of clk120 labeled clk120*b* may be fed to conversion circuit 27. In another embodiment, additionally or alternatively clk120 or its inverted version clk120*b* and one or more of clk0 and clk240 may be fed to conversion circuit 27, possibly in inverted form.

Conversion circuit 27 outputs a parallel data stream pdata which in the embodiment of FIG. 2 is a 9-bit signal. In other embodiments, different bit widths are also possible. The nine parallel bits of parallel data stream pdata will also be referred to as a frame hereinafter. Parallel data stream pdata is clocked by a clock signal frclk which in the embodiment of FIG. 2 has a frequency which is one ninth of the frequency of reference clock signal clk (or one third of clk0, clk120, and clk240). Clock signal frclk in the embodiment of FIG. 2 may be not fully synchronous with clock signals clk0, clk120, and clk240, but there may be an uncertainty in the phase relationship between frclk on the one hand and clk0, clk120, clk240 on the other hand (e.g., due to jitter). In the embodiment illustrated in FIG. 2, conversion circuit 27 may be controlled by a control signal cctrl, for example to enable or disable conversion circuit 27. Different embodiments of conversion circuits which are usable in the embodiment of FIG. 2, but also may be used in other context where a plurality of serial data streams like data0, data120, and data240 are to be converted to a parallel data stream, are discussed in the following.

Figure 3:
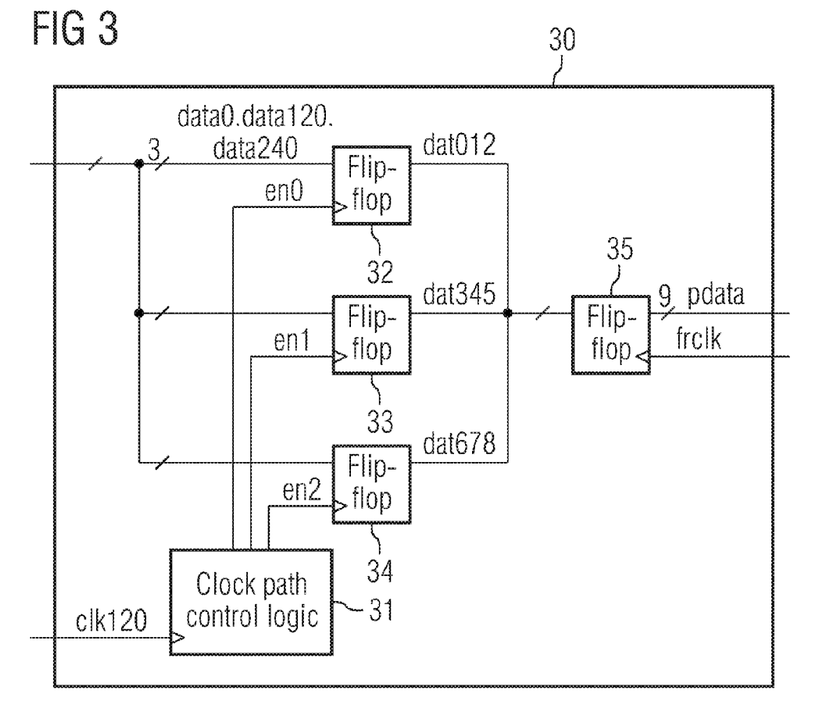
FIG. 3 illustrates a data conversion circuit according to an embodiment.

In FIG. 3, a conversion circuit 30 according to an embodiment, which for example may be used as conversion circuit 27 in the embodiment of FIG. 2 is illustrated. In the conversion circuit 30 illustrated in FIG. 3, serial data streams data0, data120 and data240 are supplied as already indicated in FIG. 2. For clarity, these three data streams are depicted as a 3-bit parallel data stream in FIG. 3.

In the embodiment of FIG. 3, this 3-bit parallel data stream is supplied to flip-flop units 32, 33, and 34, where it is sampled based on clock signals en0, en1 and en2, respectively, to produce 3 bit parallel data streams dat012, dat345, and dat678, respectively. En0, en1 and en2 are generated by a clock path control logic 31 based on clock signal clk120 in the embodiment illustrated in FIG. 3. In the embodiment of FIG. 3, clock signal clk120 is a clock signal underlying data stream data120 where as data0 and data240 are based on clock signals shifted by 120 degrees with respect to clk120 in the negative and positive direction, respectively.

The three 3-bit data streams dat0, dat012, dat345, and dat678 are fed to a flip-flop unit 35 where these three 3-bit data streams are sampled based on a clock signal frclk which has one third the clock rate of clk 120 to produce a 9 bit parallel data stream pdata.

Therefore, in the embodiment of FIG. 3 a conversion of the data format from three serial data streams to a parallel data stream and a conversion of the clock domain, also designated clock domain crossing, from clk0-clk240 to frclk is performed.

While in the embodiment of FIG. 3, three flip-flop units 32, 33, and 34 are provided wherein the sampling of data0, data120, and data240 is performed based on flip-flop (e.g., three flip-flops in each flip-flop unit, one flip-flop for sampling data0, one flip-flop for sampling data120, and one flip-flop for sampling data240), in another embodiment other types of sampling circuits, for example latches, may be used.

In a similar manner, while in the embodiment illustrated in FIG. 3, a flip-flop unit 35 which for example may comprise nine flip-flops for sampling the three 3-bit data streams dat012, dat345, and dat678 is used, other types of sampling circuits like latches may be used for producing the 9 bit data stream pdata.

As explained, in the embodiment of FIG. 3, clock path control logic 31 generates clock signals en0, en1, and en2 based on clock signal clk 120. A clock path control logic 31 according to an embodiment is next explained with reference to FIG. 4.

Figure 4:
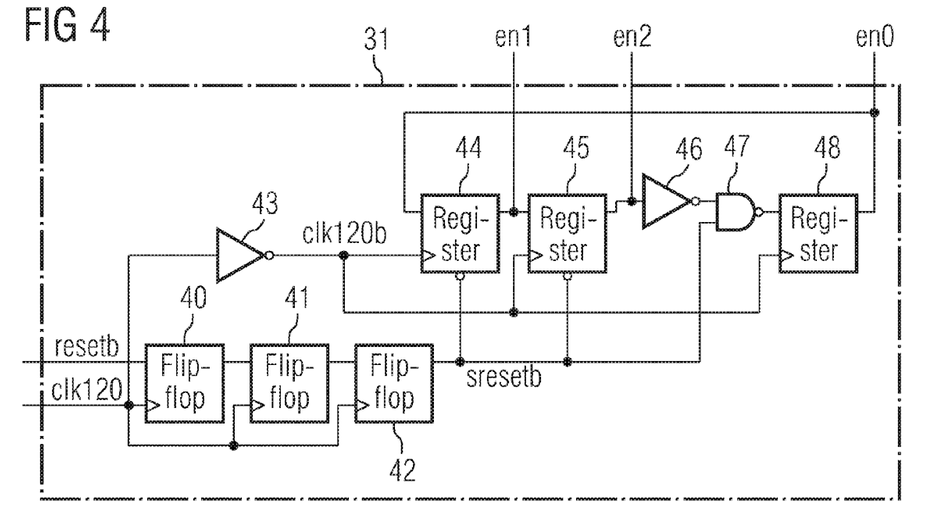
FIG. 4 illustrates an embodiment a clock path control logic.

The embodiment illustrated in FIG. 4 generates clock signals en1, en2 and en0 based on an inverted version clk120*b* of clock signal clk120 which is generated by an inverter 43. To generate clock signals en1, en2, and en0, a shift register like structure is used comprising registers 44, 45, and 48, an inverter 46 and a NAND-gate 47. Registers 44, 45, and 48 are clocked by clock signal clk120*b* (e.g., by rising edges thereof) to shift a single logic one around from register 48 to register 44, from register 44 to register 45, and from register 45 further again to register 48, etc. To start this "loop" in a defined manner, a reset structure is provided in the embodiment illustrated in FIG. 4 comprising flip-flops 40, 48, and 42, which are clocked by clock signal clk120 (e.g., by rising edges thereof). Flip-flops 40, 41, and 42 in the embodiment of FIG. 4 are coupled in series, and flip-flop 40 is supplied with a reset signal resetb which may or may not be synchronized with clock signals clk120 and/or clk120*b*. The chain of flip-flops 40, 41, and 42 generates a synchronized reset signal sresetb, which is fed to register 44, register 45 and NAND-gate 47 in the embodiment of FIG. 4.

Reset signal resetb is an external reset signal for example generated at start-up of the system. Through this reset structure, when a reset is performed, registers 44 and 45 are reset to output a zero. Register 48 is not reset, but fed with a logic 1 via NAND-gate 47 to output a logic one. Therefore, in the embodiment of FIG. 4 with a reset, the system is put to a state where en0 corresponds to logic 1 and en1, en2 each correspond to logic 0.

In an embodiment of a clock path control logic, flip-flops 40, 41, and 42 may be omitted, and the reset may be performed directly by an external reset signal, for example a synchronized reset signal. In an embodiment, no reset structure is used. In an embodiment, a different circuit may be used for synchronizing an external reset signal, for example a circuit using a different number of flip-flops than the one illustrated.

Figure 5:
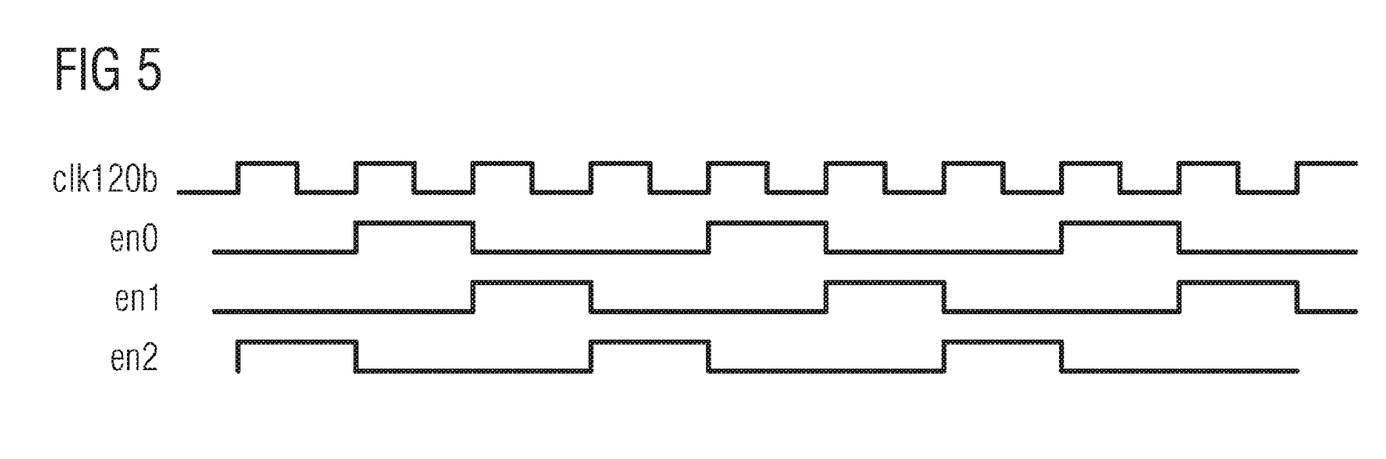
FIG. 5 illustrates exemplary waveforms of signals corresponding to the embodiment of FIG. 4.

In FIG. 5, exemplary waveforms generated by the embodiment illustrated in FIG. 4 are illustrated to illustrate the functioning of this embodiment of a clock path control logic. In FIG. 5, an exemplary inverted clock signal clk120*b* and resulting clock signals en0, en1, and en2 are illustrated. As illustrated, en0, en1, and en2 are phase shifted with respect to one another by 120 degrees and each have a clock frequency one third of the clock frequency of clk120*b*.

As illustrated by the exemplary waveforms of FIG. 5, by using the clock path control logic of FIG. 4 in the embodiment of FIG. 3 in the flip-flop units 32, 33, and 34, data 0, data 120, and data 240 are sampled with every third rising edge of clk120*b*, wherein the samplings are phase shifted by 120 degrees or one period of clk120*b* with respect to one another.

Figure 6:
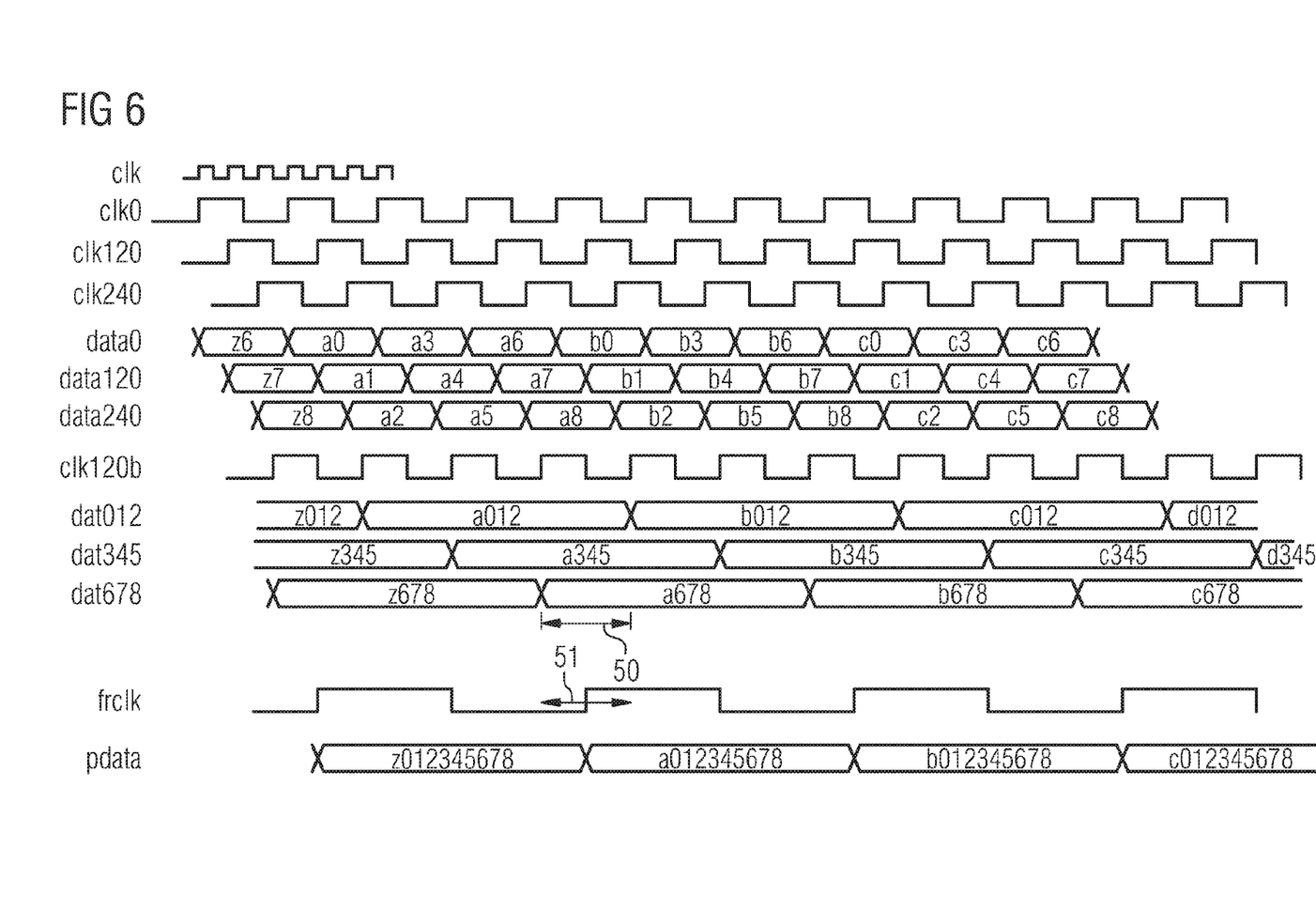
FIG. 6 illustrates exemplary waveforms of signals corresponding to the embodiment of FIG. 3.

Next, the operation of the conversion circuit of the embodiment illustrated in FIG. 3 is explained in more detail using exemplary waveforms as illustrated in FIG. 6. In FIG. 6, for illustration purposes it is assumed that conversion circuit 30 of the embodiment of FIG. 3 is used in an interface circuit like the one illustrated in FIG. 2 where a serial data stream sdata is sampled by three clocks clk0, clk120, and clk40 to produce serial data seams data0, data120, and data240 as explained with reference to FIG. 2. In FIG. 6, in the first four lines, the reference clock signal clk and clock signals clk0, clk120, and clk240 each having a frequency one third of the frequency of clk and phase shifted with respect to each other by 120 degrees. Clock signals clk0, clk120, and clk240 are used to sample the serial data stream sdata to produce data streams data0, data120, and data240 as illustrated in FIG. 6. The bits (which again serve as an example for data symbols) of data0, data120 and data240 in FIG. 6 are each labeled with a combination of a letter (a, b, ...) and a number. The letter indicates a frame or nine bit unit for which the respective bit is intended in the final parallel data stream pdata, and the number indicates a bit position within said the nine bit frame. For example, as will be explained below, bits a0 to a8 are intended to form bits 0 to 8 of a nine bit frame. Serial data stream s data in an embodiment may be a data stream where bits are transmitted sequentially, the bits being labeled a0, a1, ..., a8, b0, b1, ..., b8, ....

Furthermore, in FIG. 6 clk120*b* is illustrated as inverted signal clk120. From signal clk120*b*, clock signals en0, en1 and en2 as illustrated in FIG. 5 are derived and used in the example of FIG. 6 to sample streams data0, data120, and data240 to produce three bit stream dat012, dat345, and dat678 which are also illustrated in FIG. 6. The labels in the waveforms of dat012, dat345, and dat678 indicate which three bits are present in the respective symbol period of the respective signal. For example, a012 indicates that in the respective symbol period, bits are a0, a1, and a2 are present.

In the embodiment of FIG. 3, streams dat012, dat345, and dat678 are then sampled with clock signal frclk to generate a nine-bit signal pdata, wherein again the labeling describes which bits are present in which symbol period. For example, a012345678 indicates that in the respective symbol period, pdata comprises bits a0 to a8.

As can be seen in FIG. 6, in the embodiment of FIG. 3, clock signal frclk as indicated by arrow 51 may be shifted within a window 50 which is three unit intervals or clock cycles of reference clock signal clk wide while still yielding the correct result (i.e., still the bits labeled with the same small letter are sampled together). In other words, in the embodiment of FIG. 3 there may be a misalignment between clk 120 and frclk within window 50 (i.e., frclk may be a clock signal of a clock domain which is not completely aligned, i.e., not completely at a nominal phase relationship with the clock domain comprising e.g., clk120, for example due to jitter).

Note that the example waveforms illustrated in FIGS. 5 and 6 are merely intended to illustrate example operations of the embodiments illustrated in FIGS. 3 and 4, and the embodiments of FIGS. 3 and 4 are not limited to the use of these waveforms.

Figure 7:
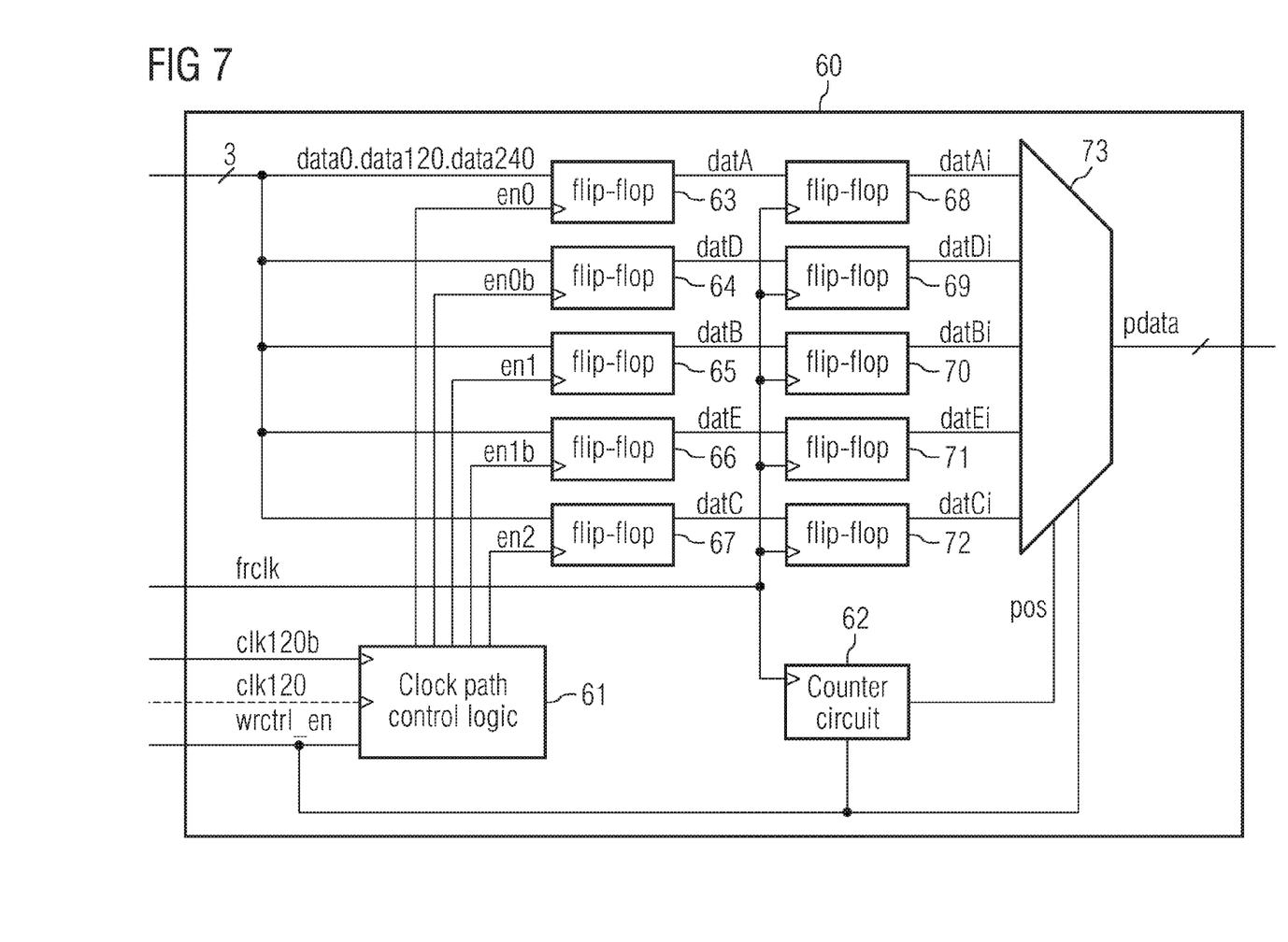
FIG. 7 illustrates a data conversion circuit according to an embodiment.

An embodiment of a conversion circuit is next described with reference to FIG. 7. In FIG. 7, a conversion circuit 60 is illustrated which, for example, may be used as conversion circuit 27 in the embodiment of FIG. 2. In the embodiment illustrated in FIG. 7, serial data streams data0, data120, and data240 are depicted as a three-bit parallel data stream. Data0, data120, and data240 are fed to flip-flop units 63, 64, 65, 66, and 67, respectively, to be sampled based on clock signals en0, en0b, en1, en1b, and en2, respectively, to generate 3-bit data signals datA, datB, date, and datC, respectively. Clock signals en0, en0b, en1, en1b, and en2 in the embodiment of FIG. 7 are generated by a clock path control logic 61. In the embodiment of FIG. 7, clock path control logic 61 is supplied with a clock signal clk120 underlying serial data stream data120 and its inverted version clk120b. Furthermore, clock path control logic 61 is supplied with a control signal wrctrl_en the function of which is explained later and which is an example for signal cctrl illustrated in FIG. 2.

In an embodiment, flip-flop units 63-67 each may comprise three flip-flops for sampling serial data streams data0, data120, and data240. In other embodiments, other sampling circuits may be used.

In the embodiment of FIG. 7, three-bit signals datA, datD, datB, date and datC are supplied to flip-flop units 68, 69, 70, 71, and 72, respectively, and sampled based on clock signal frclk to generate three bit data signals datAi, datDi, datBi, datEi, and datCi, respectively. In an embodiment, flip-flop units 68-72 each may comprise three flip-flops, one for sampling each bit of the signal supplied to them. In other embodiments, other sampling circuits may be used.

Three-bit signals datAi, datDi, datBi, datEi and datCi in the embodiment of FIG. 7 are supplied to a multiplexer 73, wherein multiplexer 73 depending on a control signal pos which in the embodiment of FIG. 7 is an n-bit signal selects three of the three-bit signals supplied to form parallel output data stream pdata. Control signal pos is generated by a counter circuit 62, which is clocked by clock signal frclk and which also receives control signal wrctrl_en.

In the embodiment of FIG. 7, clock signal frclk has one third the clock frequency of clock signal clk120. frclk and clk120 in the embodiment of FIG. 7 need not be perfectly synchronized (i.e., have a predetermined phase relationship) but a phase mismatch is possible. An amount of allowed phase mismatch (which for example may be caused by jitter) in an embodiment may be selected by control signal wrctrl_en. The amount of phase mismatch may in an embodiment be determined at initialization of the system, for example by stepwise increasing the allowed phase mismatch until a correct output data stream pdata is generated. In such an embodiment, wrctrl_en may be static signal determined at initialization or startup of the system and then kept constant. In another embodiment, wrctrl_en may change during operation (e.g., to react to changes of the phase mismatch between clk0, clk120 or clk240 and frclk). In an embodiment, wrctrl_en is a three bit signal for selecting a phase mismatch or timing window. In the embodiment of FIG. 7, the timing window may be set to three unit intervals or clock cycles of reference clock signal clk (corresponding to one clock cycle of clock signal clk120), to six units intervals of reference clock signal clk or to nine unit intervals of reference clock signal clk.

In the embodiment of FIG. 7, depending on the selection only some or all of clock signals en0, en0b, en1, en1b, and en2 and consequently some or all of signals datA to date and datAi to datEi are used. In an embodiment, for a timing window of three unit intervals indicated, for example, by a bit code of control signal wrctrl_en of 001 uses clock signals en0, en1, en2, but not clock signals en0b and en0b, and the signals datD, date, datDi, datEi resulting therefrom. A timing window of six unit intervals in this embodiment may be indicated by a bit code 010 and uses clock signals en0, en0b, en1 and en2 and the corresponding sampled signals, but not clock signal en1b. A timing window of nine unit intervals in this embodiment may be indicated by a bit code 100 and uses all clock signals en0, en0b, en1, en1b, and en2. In other embodiments, different codes and/or different clock signals may be used for different timing windows.

Figure 8:
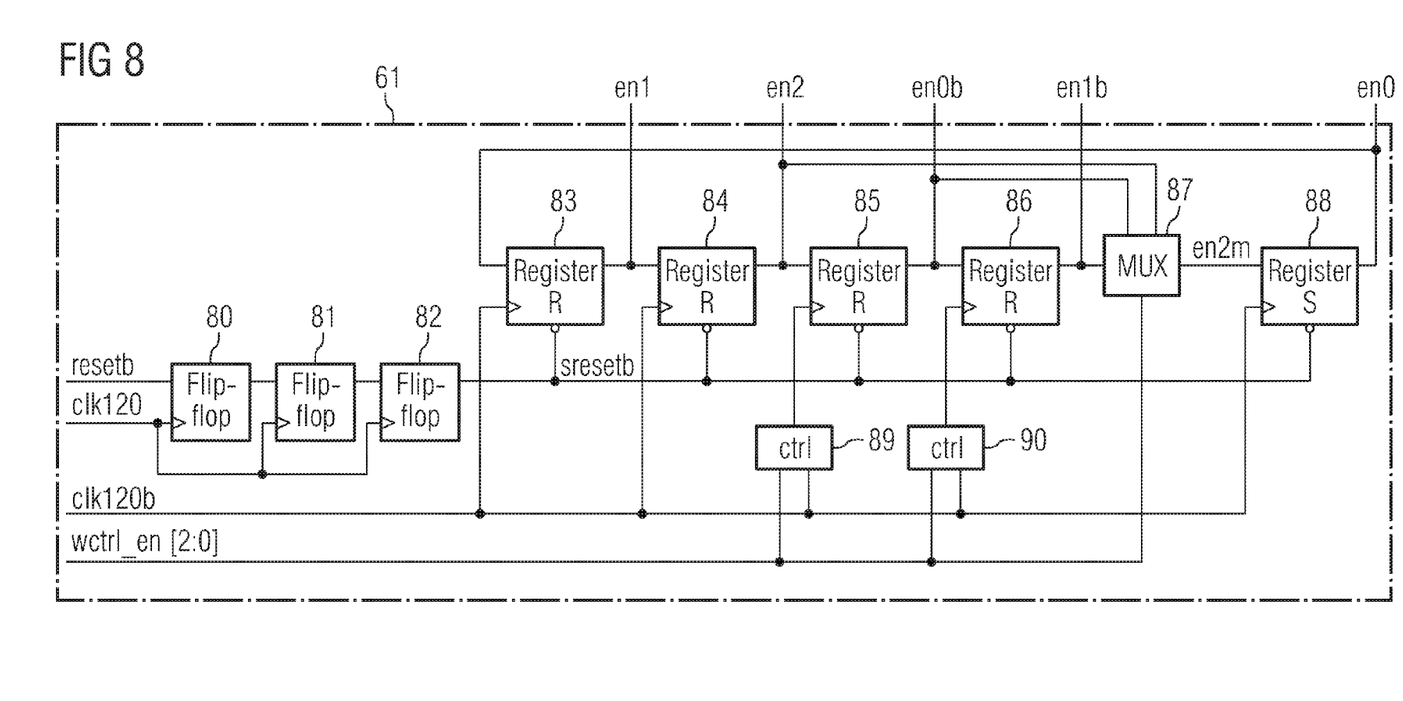
FIG. 8 illustrates a clock path control logic according to an embodiment.

In the following, embodiments of components of the embodiment of FIG. 7 are explained in more detail. In FIG. 8, a clock path control logic 61 according to an embodiment is illustrated. The embodiment of FIG. 8 is supplied with clock signal clk120 and its inverted version clk120b. In a different embodiment, only clock signal clk 120 is supplied to clock path control unit, and the inverted version clk 120b is generated internally for example by using an inverter. Furthermore, control signal wctrl_en which in this embodiment is a three-bit signal as explained above is supplied to clock path control logic unit 61. The embodiment of the clock path control logic 61 illustrated in FIG. 8 comprises an input for receiving a reset signal resetb which is an external reset signal generated for example at start-up of the system to set the clock path control logic 61 of the embodiment of FIG. 8 to a defined starting state.

Reset signal resetb is fed to a chain of three flip-flops 80, 81 and 82 coupled in series which are clocked by clock signal clk120 to generate a synchronized reset signal sresetb (i.e., a reset signal synchronized to clk120). The clock signals en0, en1, en2, en0b, and en1b are generated by a series of registers 83, 84, 85, 86, and 88 connected to form a shift register like structure, wherein a single logic 1 is shifted around. Registers 83, 84, 85, 86, and 88 are clocked by inverted clock signal clk120b. In case of registers 85 and 86, this clocking is effected via control gates 89 and 90 which are controlled by signal wctrl_en to clock registers 85 and 86 only if the respective output signals en0b and en1b are needed in a mode of operation specifying a timing window as explained above. A multiplexer 87 is provided to "bridge" register 86 or registers 85 and 86 in case en1b or, in another mode, en0b and en1b are not needed and to output one of en2, en1b and en0b as signal en2m. Multiplexer 87 is also controlled by wctrl_en.

In the embodiment of FIG. 8, the synchronized reset signal sresetb is fed to reset inputs of registers 83 to 86 and to a set input of register 88 such that upon reset, en0 is set to 1 and en1, en2, en0b and en1b are set to zero.

Next, an embodiment of multiplexer 73 of FIG. 7 is discussed. Multiplexer 73 is controlled by signals pos and wctrl_en. In an embodiment, the multiplexer 73 selects data signals according to the following table 1:

TABLE 1

| pos | wrctrl_en 001 | 010 | 100 |
|---|---|---|---|
| 000 | | pdata210<=datAi<br>pdata543<=datBi<br>pdata876<=datCi | pdata210<=datAi<br>pdata543<=datBi<br>pdata876<=datCi | pdata210<=datAi<br>pdata543<=datBi<br>pdata876<=datCi |
| 001 | | | pdata210<=datDi<br>pdata543<=datAi<br>pdata876<=datBi | pdata210<=datDi<br>pdata543<=datEi<br>pdata876<=datAi |
| 010 | | | pdata210<=datCi<br>pdata543<=datDi<br>pdata876<=datAi | pdata210<=datBi<br>pdata543<=datCi<br>pdata876<=datDi |
| 011 | | | pdata210<=datBi<br>pdata543<=datCi<br>pdata876<=datDi | pdata210<=datEi<br>pdata543<=datAi<br>pdata876<=datBi |
| 100 | | | | pdata210<=datCi |

TABLE 1-continued

| pos | wrctrl_en | 001 | 010 | 100 |
|---|---|---|---|---|
| | | | | pdata543<=datDi |
| | | | | pdata876<=datEi |

In the above table 1, the selection performed by multiplexer 73 depending on the signal pos and on three-bit signal wrctrl_en, wherein 001 corresponds to a timing window of three unit intervals, 010 corresponds to a timing window of six unit intervals and 100 corresponds to a timing window of nine unit intervals. In this embodiment, pos is a three bit signal which assumes values from 000-100 or, in decimal numbers, from 0-4. For value of wrctrl_en of 001 corresponding to a timing window of 3 unit intervals in the currently discussed embodiment, only a value pos=000 is used, and as indicated in the above Table 1, datAi is used for bits 0-2 of pdata (labeled pdata210 in Table 1), datBi is used for bits 3-5 of pdata (labeled pdata543 in Table 1), and datCi is used for bits 6-8 of pdata (labeled pdata876 in Table 1). In case of wrctrl_en=010 corresponding to a timing window of 6 unit intervals in the embodiment described by Table 1, signals datAi, datBi, datCi, and datDi are used depending on the value of the signal pos, pos assuming values from 000-011 (or 0-3) in this case. When the wrctrl_en=100, depending on the value of pos from 000-100 three signals of datAi to datEi are used for pdata.

In an embodiment, counter circuit 62 comprises a cyclic counter clocked by frclk which cyclically counts pos in the range determined by the wrctrl_en, i.e., pos remains at 000 when wrctrl_en=001, pos counts from 000-011 and then starts again at 000 when wrctrl_en=010 and pos counts from 000-100 and then starts again at 000 when wrctrl_en=100 in this embodiment.

Figure 9:
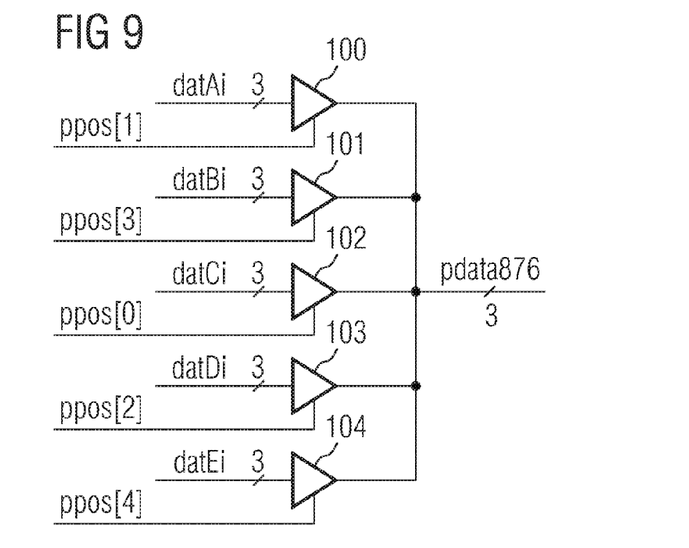
FIG. 9 illustrates part of a multiplexer according to an embodiment.

An implementation of multiplexer 73 according to an embodiment is next discussed with reference to FIG. 9. In FIG. 9, a part of multiplexer 73 for selecting bits 8, 7, and 6 of pdata, i.e., pdata876, is illustrated. In an embodiment, similar circuitry is used for selecting bits 5, 4, and 3 and for selecting bits 2, 1, and 0, or, in other words, a multiplexer according to an embodiment comprises three circuits as illustrated in FIG. 9.

The circuit illustrated in FIG. 9 comprises five buffers 100-104, wherein each of signals datAi to datEi is supplied to one of buffer 100-104 as illustrated in FIG. 9.

Buffers 100-104 are controlled by a control signal ppos which in the embodiment of FIG. 9 is a five bit signal, wherein each bit enables or disables one of buffers 100-104. In the embodiment of FIG. 9, bit number zero of ppos controls buffer 102, bit number one controls buffer 100, bit number two controls buffer 103, bit number three controls buffer 101, and bit number four controls buffer 104. In an embodiment, the bits of ppos are set depending on the counter pos and the wrctrl_en according to the above Table 1. For example, when wrctrl_en=1, ppos[0] is set to one and the remaining bits are set to zero such that buffer 102 is enabled and buffers 100, 101, 103, and 104 are disabled. In this case, as represented in the above Table 1, pdata876 corresponds to datCi.

In case wrctrl_en=010, according to an embodiment as represented in the above Table 1 when pos=000 ppos[0] is set to one, when pos=001 ppos[3] is set to one, when pos=010 ppos[1] is set to one, and when pos=011 ppos[2] is set to one. The remaining bits of ppos are set to zero in each case. Finally, when wrctrl_en=100, when pos=0 ppos[0] is set to one, when pos=001 ppos[1] is set to one, when pos=010 ppos[2] is set to one, when pos=011 ppos[3] is set to one and when pos=100 ppos[4] is set to one, or in other words, in this embodiment when wrctrl_en=100 always the bit number corresponding to the decimal value of pos is set to one, and the remaining bits are set to zero in each case.

In an embodiment, buffers 100-104 are tristate buffers which are set to a high impedance state when the corresponding control bit is set to zero. In other embodiments, other kinds of buffers or switches for setting pdata876 to the desired one of signals datAi to datEi may be used. In still another embodiment, instead of a multiplexer using tristate buffers, a conventional multiplexer may be used.

The generation of control signal ppos based on pos and wrctrl_en in an embodiment is performed by a logic circuit which may be integrated in multiplexer 73 or counter circuit 62 in the embodiment of FIG. 7. In an embodiment, a shift register like structure may be used for cyclically shifting the "one" for enabling the desired buffer 100-104 around and which is initialized depending on wrctrl_en. In such an embodiment, this shift register may replace counter circuit 62 and be clocked by frclk.

Next, example operation of the embodiment illustrated in FIGS. 7 and 8 is further illustrated using exemplary waveforms of signals with reference to FIGS. 10-13.

Figure 10:
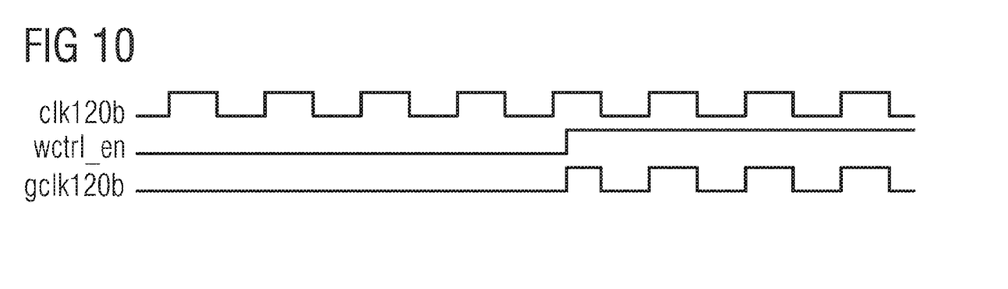
FIG. 10 illustrates exemplary waveforms of signals corresponding to the embodiment of FIG. 8.

First, operation of the clock path control logic 61 of the embodiment of illustrated in FIG. 8 is explained with reference to FIGS. 10 and 11. In FIG. 10, operation of control gates 89 and 90 of the embodiment of FIG. 8 is illustrated. Invert clock signal clk120*b* illustrated in the first line of FIG. 10 is fed to control gates 89 and 90. As long as the respective control gate is not enabled by control signal wctrl_en which is represented by this signal being zero in FIG. 10, an output signal of the respective control gate labeled gclk120*b* in FIG. 10 is zero. When wctrl_en enables the respective control gate, which is represented by a logic one of wctrl_en in FIG. 10, the output signal of the respective control gate 89, 90 corresponds to the signal clk120*b* thus enabling the respective register 85, 86.

Figure 11:
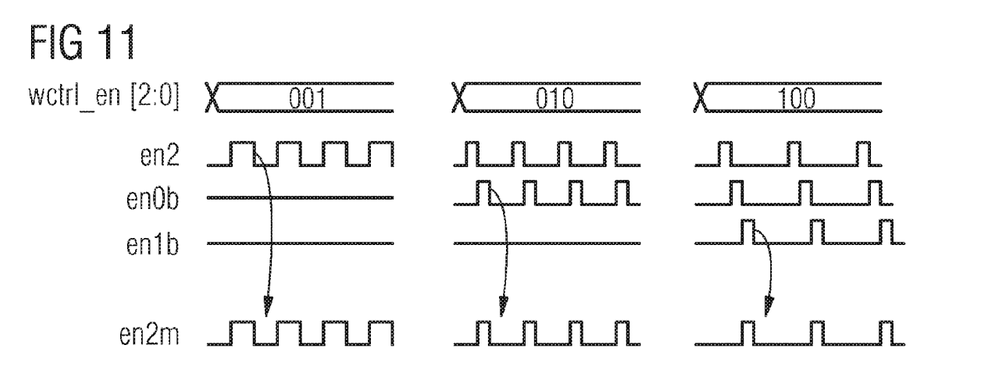
FIG. 11 illustrates exemplary waveforms of signals corresponding to the embodiment of FIG. 8.

Next, with reference to FIG. 11 the already described operation modes of clock path control logic 61 of the embodiment of FIG. 8 are further discussed. In FIG. 11, the signal en2, en0*b*, en1*b* and the output of multiplexer 87 en2*m* are illustrated for the three cases of wctrl_en=001, 010 and 100.

In case wctrl_en=001, as already explained en0*b* and en1*b* are zero since the respective registers are not clocked via control gate 89, 90. In this case, signal en2*m* is selected to correspond to en2 by multiplexer 87.

In case wctrl_en=010, register 85 is supplied with clock clk120*b* via control gate 89, while register 86 is still disabled. In this case, in the embodiment of FIG. 8 clock signal en0*b* is generated and output as signal en2*m* by multiplexer 87.

When wctrl_en=100, both clock signals en0*b* and en1*b* are generated, and clock signal en1*b* is output as signal en2*m* by multiplexer 8.

As indicated in FIG. 11, the clock frequency of clock signals en1, en2, en0*b*, en1*b*, and en0 changes depending on the control signal wctrl_en and generally corresponds to the frequency of clk120*b* divided by the number of activated clock signals. For example, when wctrl_en=001, three clock signals (e.g., en1, en2, en0) are activated, and the clock frequency of these clock signals is one third of the frequency of clk120*b*. When wctrl_en=100, five clock signals en0, en1, en2, en0*b* and en1*b* are generated, the clock frequency of which corresponds to one fifth of the frequency of clock signals clk120*b*.

Figure 12:
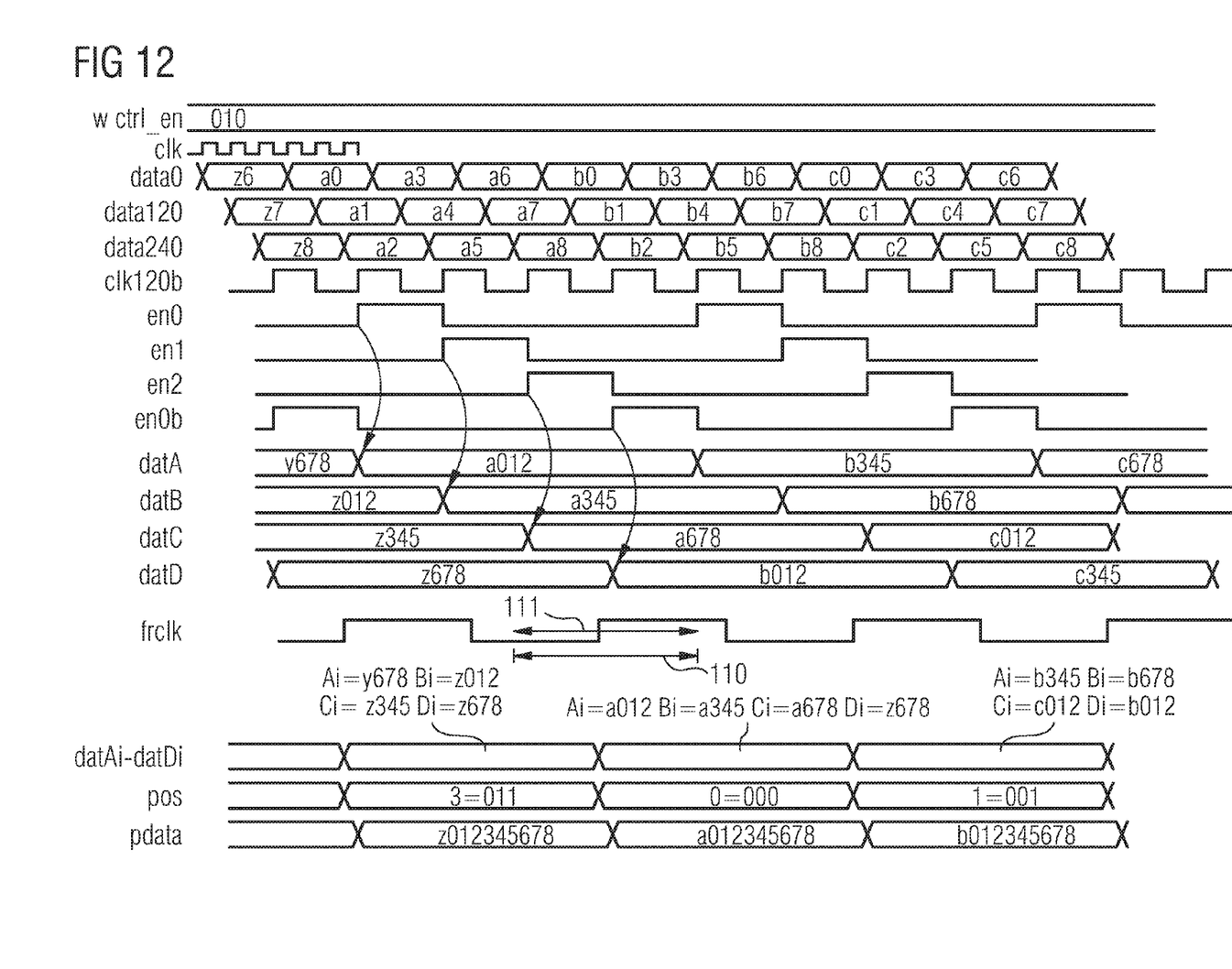
FIG. 12 illustrates exemplary waveforms of signals corresponding to the embodiment of FIG. 7 in an example mode of operation.
Figure 13:
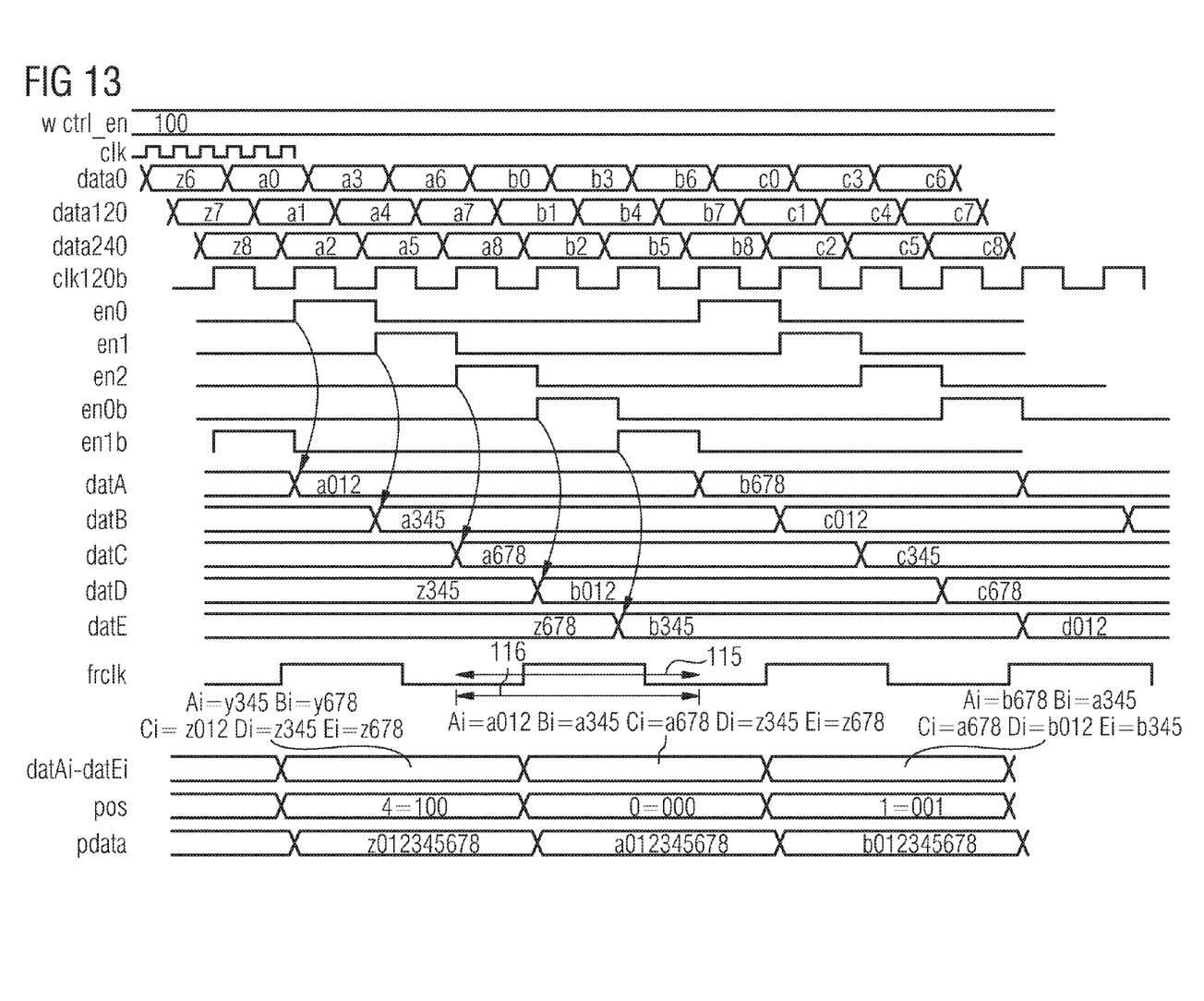
FIG. 13 illustrates exemplary wave forms corresponding to the embodiment of FIG. 7 in an example mode of operation.

Next, waveforms in the embodiment of FIG. 7 for various values of wctrl_en are discussed with reference to FIGS. 12 and 13, wherein FIG. 12 illustrates waveforms for wrctrl_en=010 and FIG. 13 illustrates waveforms for wctrl_en=100. Note that the waveforms in the case wctrl_en=001 in an illustrative example correspond to the ones already discussed with reference to FIGS. 5 and 6, wherein en0*b* and en1*b* are deactivated (i.e., zero).

In the illustrative example of FIG. 12, the waveforms of clock signal clk and data0, data120, and data240 are the same as already used as illustrative examples in FIG. 6 and therefore are not be described again. Clock signals en0, en1, en2, and en0*b* are generated based on inverted clock signal clk 120*b* and have a clock frequency one fourth of the frequency of clk 120*b*. Serial data streams data0, data120, and data240 in the illustrative example of FIG. 12 are sampled with the rising edges of en0, en1, en2, and en0*b* to generate 3-bit signals datA, datB, datC, and datD, respectively. The symbols of datA-datD are labeled with the respective bits of data0 to data240, wherein for example a012 represents bits a0, a1, and a2 of serial data streams data0, data120, and data240 respectively.

Three-bit parallel data streams datA-datD are each sampled based on clock signal frclk which has a clock frequency one ninth of clock signal clk corresponding to one third of inverted clock signal clk 120*b*. In the embodiment of FIG. 7, frclk need not be perfectly aligned to clk 120*b*, but may be phase-shifted within a window 110 which is, in case of wctrl_en=010, six periods or units intervals of signal clk wide. In other words, frclk may be shifted as indicated by arrow 111 within window 110.

In FIG. 12, the signals datAi to datDi which each are three-bit parallel signals and which, as all being sampled by frclk, are in phase, are depicted in a common line. Within the symbols, the bit values for each of the signals datAi to datDi are given, wherein for example Bi=z012 indicates that signal datBi during this period has bit values corresponding to z0, z1 and z2 of serial data streams data0, data120, and data240.

In the penultimate line of FIG. 12, signal pos is illustrated in an exemplary manner, wherein the value of pos is given both as decimal and as binary number. For output signal pdata, signals are selected according to the above-discussed Table 1 in this embodiment. In the illustrative example of FIG. 12, as pdata eight bit values are output comprising those bits of serial data streams data0, data120, and data240 which are marked with the same small letter, for example bits z0-z8, within a single symbol period.

Next, an illustrative example for waveforms when wctrl_en=100 is given with reference to FIG. 13. Signals clk, data0, data120, data240, and clk120*b* of FIG. 13 correspond to the ones in FIG. 12. Since in the illustrative example in FIG. 13, wctrl_en=100, five clock signals en0, en1, en2, en0*b*, and en1*b* are generated by clock path control logic 61 of the embodiment of FIG. 7 each having a clock frequency of one fifth of the clock frequency of clk 120*b*. Serial data streams data0, data120 and data240 are sampled at the rising edges of clock signals en0, en1, en2, en0*b*, and en1*b* to generate three-bit data signals datA, datB, datC, datD, datE, respectively, the labeling of which corresponds to the one already explained with reference to FIG. 12.

Three-bit data streams datA-datE are sampled by clock signal frclk which in case of wctrl_en=100 only needs to be aligned with clk 120*b* within a window 116 which is nine periods or units intervals of signal clk wide (i.e., frclk may be shifted as indicated by arrow 1115).

In FIG. 13, signals datAi to datEi generated by sampling signals datA to datE with frclk are illustrated in a common line, wherein the respective symbols are labeled with the values of the three bits of each of signals datAi to datEi. In the penultimate line, signal pos is illustrated which is cyclically counted from zero to four in the embodiment of FIG. 7. Depending on signal pos, three signals from signals datAi to datEi are selected to form nine bit parallel data stream p data in which in the illustrative example of FIG. 13 nine bit values are formed by the bits of serial data streams data 0 to data 240 labeled with the same small letter.

The waveforms of FIGS. 12 and 13 are merely intended as an illustrative example for illustrating a possible operation of the embodiments illustrated in FIGS. 7 and 8, and an embodiment of the invention may also be operated using different waveforms.

In the embodiment of FIGS. 7 and 8, the control signal wctrl_en is used to switch between three operating modes where an allowed mismatch between clock frclk and clock signal clk 120*b* is three unit intervals of clk, six unit intervals of clk and nine unit intervals of clk, respectively. In another embodiment, no such control signal is provided, and the conversion circuit is adapted to one of the operation modes. An embodiment of a clock path control logic 61A in such a case is illustrated in FIG. 14, wherein the embodiment illustrated in FIG. 14 generates five clock signals en1, en2, en0*b*, en1*b* and en0 based on inverted clock signal clk 120*b*.

Figure 14:
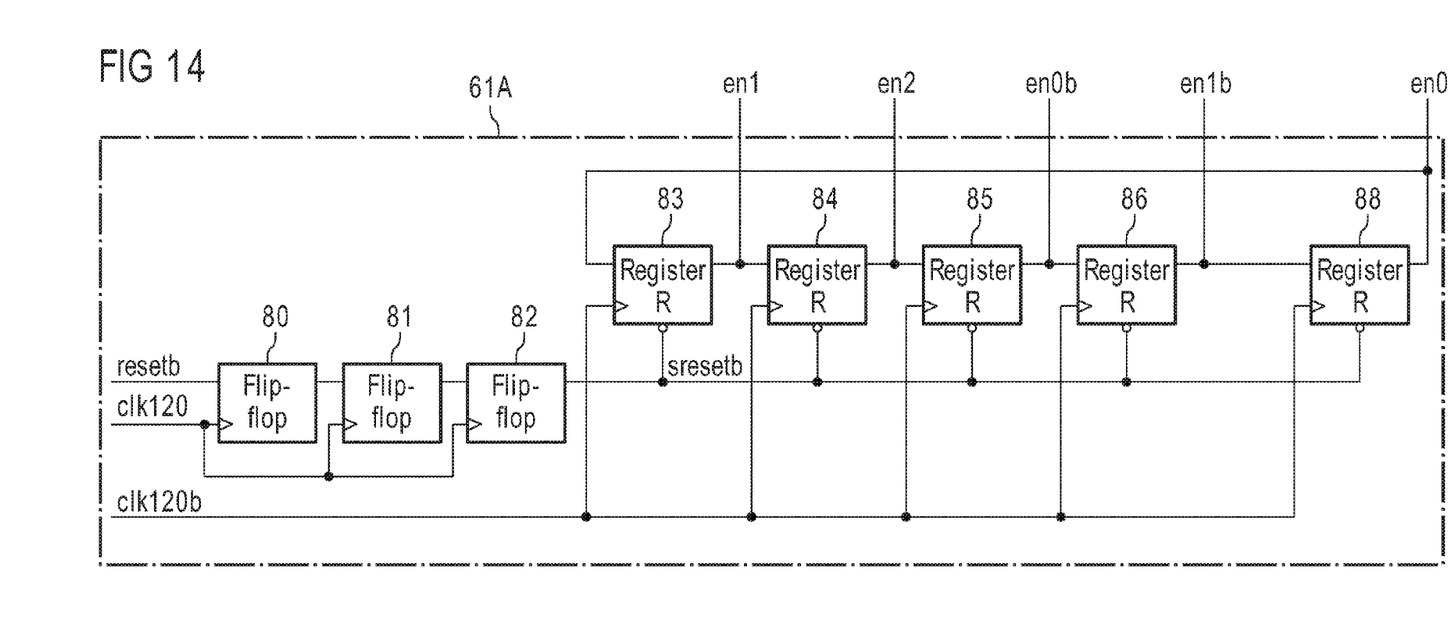
FIG. 14 illustrates a clock path control logic according to an embodiment.

In the embodiment of FIG. 14, elements corresponding to elements in the embodiment of FIG. 8 are designated with the same reference numerals and, since their general operation is the same as already described with reference to FIG. 8 their description is not repeated here. The clock path control logic 61*a* of the embodiment of the invention illustrated in FIG. 14 is "hard wired" to always generate five clock signals en1, en2, en0*b*, en1*b*, and en0 by the shift register like structure comprising registers 83, 84, 85, 86, and 88. Clock path control logic 61 a may for example be used in an embodiment allowing a mismatch between frclk and clk 120*b* of nine unit intervals of signal clk.

In another embodiment, a clock path control logic may be hard wired to generate four clock signals (e.g., en1, en2, en0*b*, and en0), or three clock signals (e.g., en1, en2, and en0).

The embodiments which have been described herein are to be taken only as illustrative examples, and numerous modifications are possible for persons skilled in the art. For example, the embodiment illustrated in FIG. 7 may be switched between operating modes allowing three unit intervals, six unit intervals, and nine unit intervals of clock signal clk mismatch between frclk and clk 120*b* or another one of the clock signals underlying data0, data120, and data240. In other embodiments, greater mismatches are possible, either in a selectable operation mode or in a hard-wired manner (e.g., by providing additional clock signals for sampling data0, data120, and data240). In an embodiment, this may be achieved for example by extending the clock path control logic as for example illustrated in FIG. 8 or 14 with additional registers in the shift register like chain to generate additional clock signals and to provide a correspondingly increased number of flip-flop units 63-72 in the embodiment of FIG. 7. Moreover, while the embodiments described herein convert three serial data streams with underlying clock phase shifted with respect to each other and which may be derived from a signal serial data stream to a parallel data stream having one third of the clock frequency of the serial data streams, in other embodiment N serial data streams may be provided and converted to a parallel data stream having 1/N the clock frequency of the serial data streams.

An embodiment is applicable in situations where three serial data streams are provided, for example from various sources, or may comprise circuitry to convert a single serial data stream to three serial data streams. An embodiment may be applied in situations where serial data streams are to be converted to a parallel data stream, wherein a clock underlying the parallel data stream is different from clocks underlying the serial data streams, for example having a different clock frequency and a phase mismatch in a predetermined or detectable range. Such an embodiment may, for example, be used between circuits as illustrated in FIG. 1 (e.g., between a memory controller and a memory). Furthermore, while bits have been used as examples for data symbols of the various data streams described, other types of data symbols may also be used.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit comprising:
a data conversion circuit comprising:
a first input configured to receive a first serial data stream;
a second input configured to receive a second serial data stream;
a third input configured to receive a third serial data stream;
a first sampling circuit coupled to the first, second, and third inputs and configured to sample the first to third data streams based on a plurality of clock signals and to generate a corresponding plurality of first sampled signals; and
a second sampling circuit configured to sample the plurality of first sampled signals based on a further clock signal, the further clock signal having a clock frequency different from a clock frequency underlying the first to third serial data streams, wherein the clock frequency of the further clock signal is one third of the clock frequency of the clock frequency underlying the first to third serial data streams.

2. The circuit according to claim 1, wherein a clock frequency of the plurality of clock signals is equal to or greater than a clock frequency of the further clock signal.

3. The circuit according to claim 1, wherein a number of the plurality of clock signals is at least three.

4. The circuit according to claim 1, comprising:
a clock generation circuit configured to generate the plurality of sampling clock signals based on a clock signal underlying one of the first, second, and third serial data streams.

5. The circuit according to claim 1, wherein each data symbol of the first sampled signals comprises a data symbol of the first serial data stream, a data symbol of the second serial data stream, and a data symbol of the third serial data stream.

6. A circuit comprising:
a data conversion circuit comprising:
a first input configured to receive a first serial data stream;
a second input configured to receive a second serial data stream;
a third input configured to receive a third serial data stream;
a first sampling circuit coupled to the first, second, and third inputs and configured to sample the first to third data streams based on a plurality of clock signals and to generate a corresponding plurality of first sampled signals; and
a second sampling circuit configured to sample the plurality of first sampled signals based on a further clock signal, the further clock signal having a clock frequency different from a clock frequency underlying the first to third serial data stream, wherein the data conversion circuit comprises:
a fourth input configured to receive a fourth serial data stream; and
a third sampling circuit coupled to the fourth input and configured to sample the fourth serial data stream with three clock signals, the three clock signals having the same frequency and being phase-shifted with respect to each other by approximately 120 degrees, to generate the first, second, and third serial data streams.

7. A circuit comprising:
a data conversion circuit comprising:
an input configured to receive N data streams, wherein N is greater than or equal to two;
a plurality of M first sampling circuits coupled to the input and configured to sample, in each of the M first sampling circuits, the N data streams, based on a respective one of M first clock signals;
a plurality of M second sampling circuits, each of the second sampling circuit being coupled to an output of one of the first sampling circuits and configured to sample signals output by the M first sampling circuits based on a second clock signal; and
a multiplexer circuit coupled to outputs of the M second sampling circuits and configured to select an output signal based on the outputs of the M second sampling circuits.

8. The circuit according to claim 7, comprising:
a clock generation circuit configured to generate the M first clock signals based on a clock signal underlying one of the N data streams.

9. The circuit according to claim 8, wherein the clock generation circuit comprises a shift register structure.

10. The circuit according to claim 8, wherein the clock generation circuit comprises a control input, wherein based on the control signal L of the M first clock signals are deactivated based on the control signal, wherein L is less than M.

11. The circuit according to claim 7, wherein the multiplexer circuit comprises a plurality of tristate buffers.

12. The circuit according to claim 7, wherein the data conversion circuit comprises:
a counter circuit configured to output a count signal controlled by the second clock signal; and
wherein the multiplexer circuit is configured to select the output signal based on the count signal.

13. The circuit according to claim 12, wherein the data conversion circuit comprises:
a control signal input coupled to the counter circuit and the multiplexer, wherein the count signal is generated based on the control signal.

14. The circuit according to claim 7, wherein N is equal to three and M is greater than or equal to N.

15. An electronic apparatus comprising:
first means for sampling three serial data streams based on first sampling clock signals, each of the three serial data streams having an underlying clock signal, the underlying clock signals having the same frequency and being phase-shifted by 120° with respect to each other;

means for generating the first sampling clock signals based on at least one of the underlying clock signals; and second means for sampling signals generated by the first means for sampling based on a second sampling clock signal, the second sampling clock signal having a frequency one third of a frequency of the underlying clock signals.

16. The electronic apparatus according to claim 15, comprising:

third means for sampling a single serial data stream based on the underlying clock signals to generate the three serial data streams.

17. The electronic apparatus according to claim 16, comprising:

means for outputting a parallel data stream based on sampled signals generated by the second means for sampling.

18. A method of data conversion, the method comprising:
receiving a first serial data stream;
receiving a second serial data stream;
receiving a third serial data stream;
sampling the first to third data streams based on a plurality of sampling clock signals to generate a corresponding plurality of first sampled signals, each data symbol of the first sampled signals comprising a data symbol of the first serial data stream, a data symbol of the second serial data stream, and a data symbol of the third serial data stream;
sampling the plurality of first sampled signals based on a further clock signal, the further clock signal having a clock frequency different from a clock frequency underlying the first to third serial data streams; and
sampling a fourth serial data stream with three clock signals, the three clock signals having the same frequency and being phase-shifted with respect to each other 120°, to generate the first, second, and third serial data streams.

19. The method according to claim 18, comprising:
generating the plurality of clock signals based on a clock signal underlying one of the first, second, and third serial data streams.

20. A method of data conversion, the method comprising:
receiving N data streams, wherein N is greater than or equal to 2;
sampling the N data circuits based on M first clock signals to generate M first sampled streams each having a width of N data symbols;
sampling each of the M first sampled streams based on a second clock signal to generate M second sampled streams; and
selecting an output stream based on the M second sampled streams.

21. The method according to claim 20, comprising:
generating the M first clock signals based on a clock signal underlying one of the N data streams.

22. The method according to claim 21, comprising:
deactivating L of the M first clock signals, wherein L is less than M.

23. The method according to claim 20, comprising:
adjusting a maximum phase mismatch between the first clock signals and the second clock signal.

* * * * *